United States Patent [19]
Koga

[11] Patent Number: 5,627,400
[45] Date of Patent: May 6, 1997

[54] SEMICONDUCTOR MEMORY DEVICE

[75] Inventor: Hiroki Koga, Tokyo, Japan

[73] Assignee: NEC Corporation, Tokyo, Japan

[21] Appl. No.: 509,235

[22] Filed: Jul. 31, 1995

[30] Foreign Application Priority Data

Aug. 1, 1994 [JP] Japan ................................. 6-197160

[51] Int. Cl.$^6$ ............................. H01L 27/10; H01L 29/00; H01L 23/48
[52] U.S. Cl. ............................. 257/529; 257/209; 257/768
[58] Field of Search ............................. 257/50, 209, 529, 257/530, 768

[56] References Cited

U.S. PATENT DOCUMENTS

| | | | |
|---|---|---|---|
| 4,460,914 | 7/1984 | te Velde et al. | 257/529 |
| 4,792,835 | 12/1988 | Sacarisen et al. | 257/768 |
| 4,811,078 | 3/1989 | Tigelaar et al. | 257/529 |

FOREIGN PATENT DOCUMENTS 62-119938  6/1987  Japan .

Primary Examiner—Mahshid D. Saadat
Assistant Examiner—Valencia Martin Wallace
Attorney, Agent, or Firm—Sughrue, Mion, Zinn, Macpeak & Seas

[57] ABSTRACT

A semiconductor memory device including (a) a plug buried in a contact hole formed through an upper insulative layer and/or a contact hole formed through upper and lower insulative layers, the plug comprising a metal having a high melting point, (b) a fuse formed in a channel formed through the upper insulative layer, the fuse comprising the same material as that of the plug, and (c) an interconnection layer formed on the upper insulative layer and connected to the plug and opposite ends of the fuse. In the semiconductor memory device, a metal layer, comprising a metal having a high melting point and formed simultaneously with the plug to fill a contact hole therewith, works as a fuse. Thus, it is possible to obtain a low-resistive fuse without increasing the number of fabrication steps relative to the prior art, resulting in higher speed operation of a memory device without cost increase.

26 Claims, 7 Drawing Sheets

SEMICONDUCTOR MEMORY DEVICE

BACKGROUND OF THE INVENTION

1. Field of the Invention

The invention relates to a semiconductor memory device, and more particularly to a semiconductor memory device in which a defective bit cell can be substituted by a redundant bit cell.

2. Description of the Related Art

In these days, a semiconductor memory device has increased integration with the result that a fabrication yield tends to be deteriorated. A latest semiconductor memory device stores excessive redundant bit cells in a memory cell array and substitutes one of the stored redundant bit cells for a defective bit cell to thereby prevent deterioration of a fabrication yield. The substitution of a redundant bit cell for a defective bit cell is carried out usually by a process of breaking a fuse that has been formed beforehand by laser beam irradiation and switching a connection in a circuit.

In the process, an additional interconnection layer to be used as a fuse is not excessively formed. In general, as a fuse is used the same layer as a layer to be used as a bit line in the case of DRAM, a grand line in the case of SRAM, or a word line in the case of a non-volatile memory such as EPROM and a flash memory.

In most cases, such a fuse is composed of heavily phosphorus-doped polysilicon; tungsten silicide (WSi) or tungsten polycide. A process for fabricating such a fuse is designed not to increase the number of fabrication steps, as will be mentioned hereinbelow.

Hereinbelow is explained a first prior art with reference to FIGS. 1 and 2A to 2C. FIG. 1 is a top plan view illustrating a fuse of a conventional DRAM, and FIGS. 2A to 2C are cross-sectional views taken along the line C—C in FIG. 1 and show a process for fabricating the fuse illustrated in FIG. 1.

First, on a p type silicon substrate 1 is formed an oxide layer 2 for isolation of elements. Then, there is formed an n channel MOS transistor including a gate oxide layer 3, a gate 4, and n type diffusion layers 5a and 5b. Subsequently the resultant structure is covered with a first interlayer insulative layer 6.

Then, there is formed a first contact hole 7 reaching the n type diffusion layer 5a through the first interlayer insulative layers 6. Subsequently, a bit line 8 composed of tungsten silicide (WSi) is formed on an inner surface of the contact hole 7. A fuse 9 is formed on the first interlayer insulative layer 6 simultaneously with the bit line 8. Then, the resultant is entirely covered with a second interlayer insulative layer 10.

Then, there is formed a capacitive contact hole 11 reaching the n type diffusion layer 5b through the first and second interlayer insulative layers 6 and 10. Subsequently, there is formed an accumulation electrode 12 coming to contact with the n type diffusion layer 5b through the contact hole 11. The accumulation electrode 12 is covered over an exposed surface thereof with a capacitive insulative layer 13, which in turn is wholly covered with a facing electrode 14. Then, as illustrated in FIG. 2A, the resultant structure is covered with a third interlayer insulative layer 16.

Then, there are formed a plurality of second contact holes 17 reaching a n type diffusion layer 5c and the fuse 9. Though not illustrated, the second contact holes 17 reach a p type diffusion layer, a word line, a bit line, and the facing electrode, and hence they are exposed to the outside. Then, the resultant is wholly covered with a barrier layer 19 made of metal. As illustrated in FIG. 2B, the resultant is further covered with a tungsten (W) layer 20 so that the second contact holes 17 are all filled.

Then, the tungsten layer 20 is anisotropically etched back to thereby form a tungsten plug 21 within in the second contact hole 17. Subsequently, the resultant is wholly covered with a metal layer, which is in turn patterned to thereby form metal interconnections 24, as illustrated in FIG. 2C.

The reason why the tungsten plug 21 is formed is as follows. With increasing minuteness of a semiconductor memory device, an aspect ratio of a contact hole becomes greater. For that reason, even if it is intended to make an electrical connection to the n type diffusion layer 5c through the second contact hole 17 only with metal, metal has a poor property of covering a step, and hence reliability of the connection cannot be obtained. Thus, it is necessary to bury the contact hole with tungsten having a superior property of covering a step.

Through the above mentioned steps, a fuse is formed. In the device illustrated in FIG. 2C, a current runs through the metal interconnection 24, the tungsten plug 21, the fuse 9 made of tungsten silicide, the tungsten plug 21, and the metal interconnection 24 in this order.

As mentioned earlier, a fuse has been composed of polysilicon, silicide or polycide in order to make it unnecessary to add extra steps for fabricating a fuse. Japanese Unexamined Patent Public Disclosure No. 62-119938 has suggested using a fuse made of tungsten (W), molybdenum (Mo), chromium (Cr) or vanadium (V) which can be melted and thus broken with low energy and whose oxides are volatile, in place of polysilicon, silicide and polycide. However, additional steps are required to construct a fuse with W, Mo, Cr or V.

In the first prior art mentioned with reference to FIGS. 1 and 2A to 2C, a fuse is composed of phosphorus-doped polysilicon, tungsten silicide or tungsten polycide, all of which have a layer resistance of a few hundreds ohms per a unit area. Accordingly, an operational speed of a memory device made of such materials is reduced in comparison with a memory device made of tungsten having a layer resistance of approximately 0.1 ohm per a unit area.

In the second mentioned prior art, No. 62-119938, a fuse is composed of metal such as tungsten. However, in this prior art, an interconnection associated with a fuse is composed also of tungsten having a greater resistivity than aluminum, and hence the same problem as that of the first prior art arises. In addition, the second prior art has to additionally include a photolithography step and an etching step for forming a tungsten layer and patterning a fuse, and accordingly it increases the number of fabrication steps.

SUMMARY OF THE INVENTION

In view of the foregoing problems of the prior art, it is an object of the present invention to provide a semiconductor memory device having a lower resistance without increasing the number of fabrication steps.

The invention provides a semiconductor memory cell including (a) a plug buried in a contact hole formed through an upper insulative layer and/or a contact hole formed through upper and lower insulative layers, the plug being composed of metal having a high melting point, (b) a fuse formed in a channel formed in the upper insulative layer, the fuse comprising the same material as that of the plug, and (c) an interconnection layer formed on the upper insulative layer and connected to the plug and opposite ends of the fuse.

In a preferred embodiment, the metal having a high melting point is selected from tungsten (W), molybdenum (Mo), chromium (Cr) or vanadium (V).

In another a preferred embodiment, the semiconductor memory device further includes an electrically conductive layer disposed beneath the fuse or the barrier layer. The conductive layer serves as an etching stopper while the channel is formed.

In a preferred embodiment, the conductive layer comprises the same material as that of an electrode or an interconnection layer to be formed on the lower insulative layer.

In a preferred embodiment, the upper and lower insulative layers comprise boron phosphorus silicic add glass (BPSG).

In preferred embodiment, the electrically conductive layer comprises a material selected from (a) polysilicon, (b) silicide of metal having a high melting point, or (c) a combination of polysilicon and silicide of metal having a high melting point.

In preferred embodiment, the interconnection layer is composed of aluminum.

In a preferred embodiment, the semiconductor memory device further includes a barrier layer disposed between the upper insulative layer and the interconnection layer and also between the fuse and the interconnection layer and further between the fuse and the interconnection layer. The barrier layer is composed of metal.

In a preferred embodiment, the barrier layer is composed of Ti/TiN.

The invention further provides a semiconductor memory cell including (a) a plug buried in a contact hole formed through an upper insulative layer and/or a contact hole formed through upper and lower insulative layers, the plug being composed of metal having a high melting point, (b) a fuse formed in a channel formed in the upper insulative layer, the fuse being composed of the same material as that of the plug, (c) a barrier layer disposed beneath the fuse, the barrier layer being composed of metal, and (d) an interconnection layer formed on the upper insulative layer and connected to the plug and opposite ends of the fuse.

In the embodiment, the semiconductor memory device further includes a second barrier layer for separating the plug from surroundings.

In the embodiment, the second barrier layer is composed of the same material as that of the barrier layer.

In the embodiment, the barrier layer extends between the upper insulative layer and the interconnection layer.

In the embodiment, the second barrier layer extends between the upper insulative layer and the interconnection layer.

The advantages obtained by the aforementioned present invention will be described hereinbelow.

In a semiconductor memory device in accordance with the invention, a layer comprising metal having a high melting point, which is formed simultaneously with a plug to bury the second contact hole therewith, is used as a fuse. Accordingly, it is possible to obtain a low resistive fuse without a greater number of fabrication steps of the prior art. The invention thus ensures a higher operational speed of a memory device without cost increase.

In addition, by composing a fuse of metal having a high melting point, such as tungsten, it is possible to melt or break a fuse with low energy. Furthermore, there can be obtained the benefit of easy removal of oxide to be generated when a fuse is melted or broken.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to the drawings.

[Embodiment 1]

Figure 1:
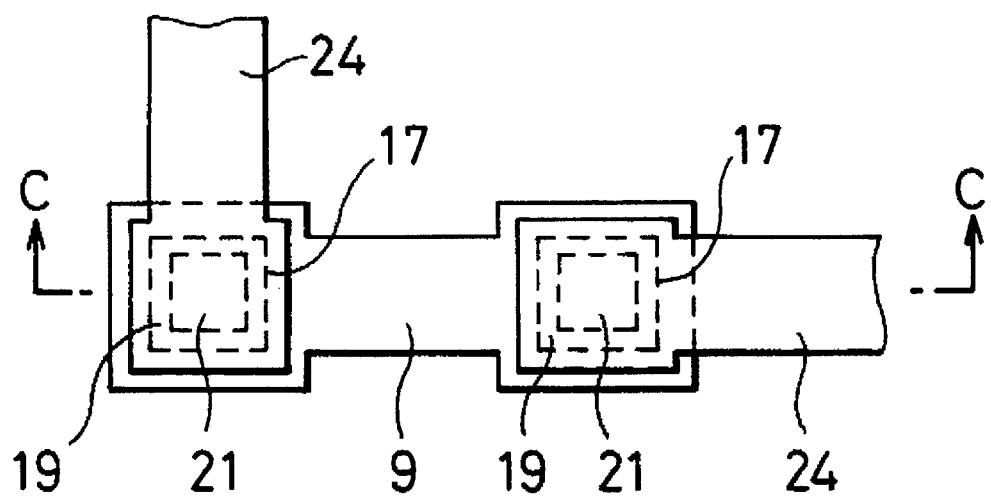
FIG. 1 is a top plan view of a fuse used in a conventional semiconductor memory device.
Figure 2A:
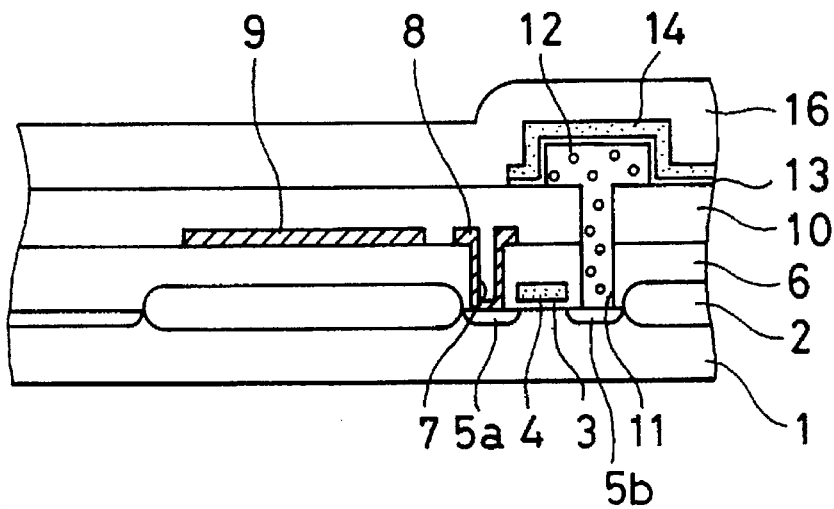
FIGS. 2A to 2C are cross-sectional views showing the steps of a conventional process for fabricating a semiconductor memory device.
Figure 2B:
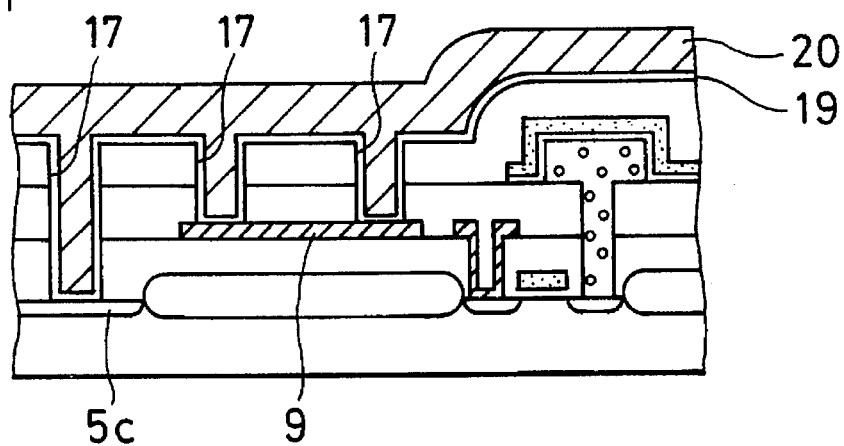
Figure 2C:
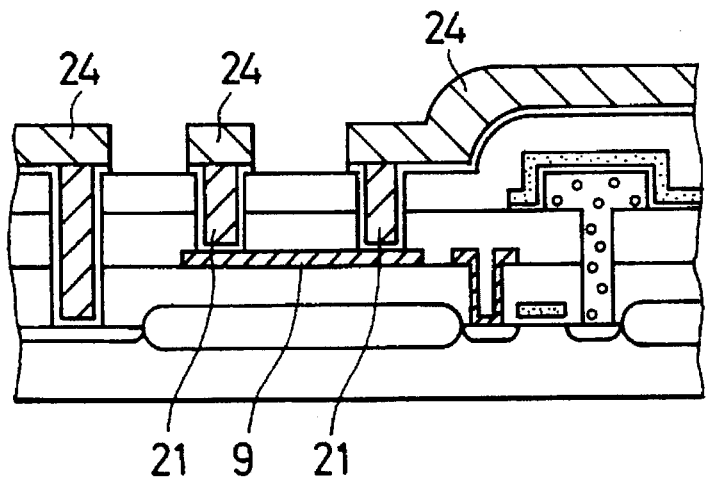
Figure 3:
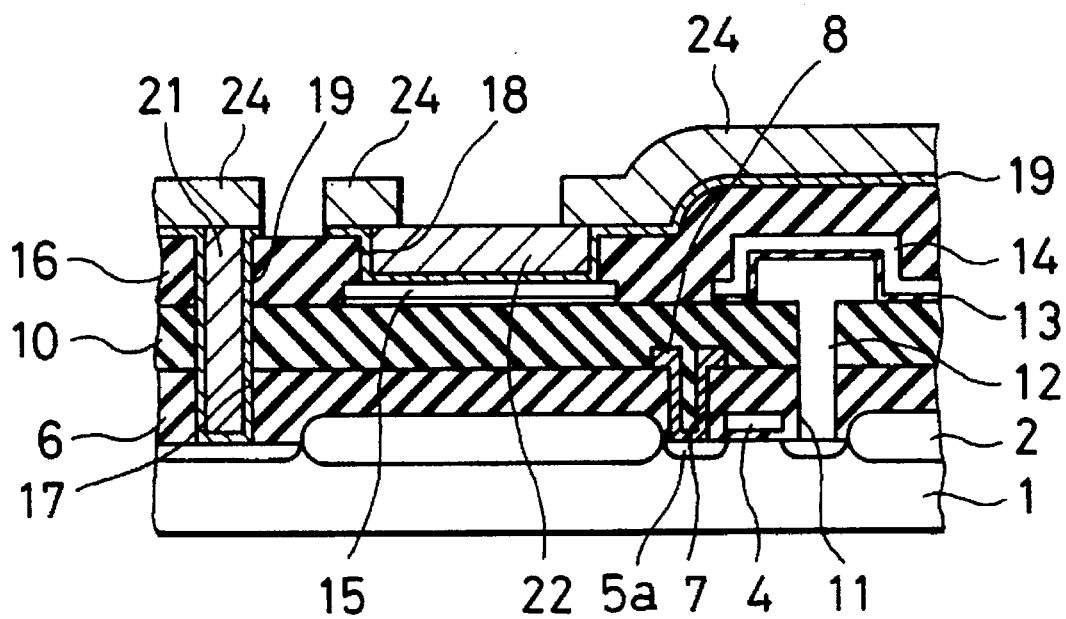
FIG. 3 is a cross-sectional view of a semiconductor memory device in accordance with the first embodiment of the present invention.
Figure 4:
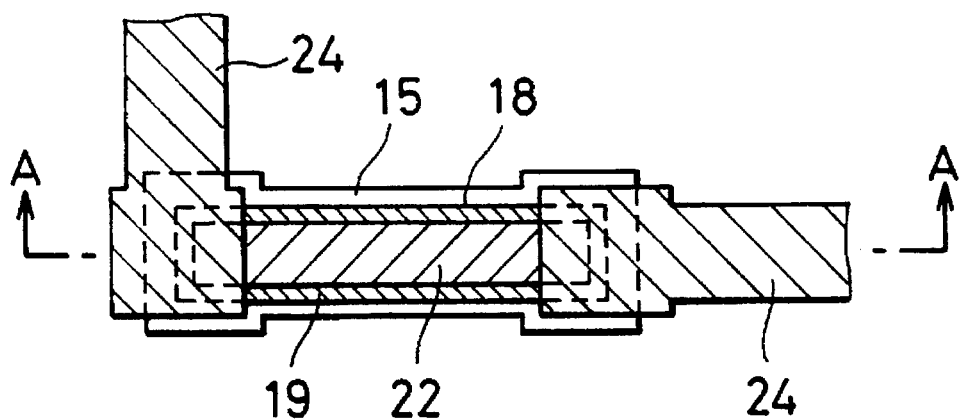
FIG. 4 is a top plan view of a fuse used in a semiconductor memory device in accordance with the first embodiment of the present invention.

FIG. 3 illustrates a semiconductor memory device in accordance with the first embodiment of the invention. FIG. 4 illustrates only a fuse used in the semiconductor memory device illustrated in FIG. 3, which is a cross-sectional view taken along the Line A—A in FIG. 4.

As illustrated in FIGS. 3 and 4, a fuse 22 is buried in a channel 18 formed in a third interlayer insulative layer 16 so that the channel 18 is filled with the fuse 22. The channel 18 is formed simultaneously with a second contact hole 17, and the fuse 22 is formed simultaneously with a tungsten plug 21 filling the second contact hole 17.

Beneath the fuse 22 is a barrier layer 19 made of metal beneath which is further formed an etching stopper 15. The etching stopper 15 is formed simultaneously with a facing electrode 14 of a capacitor for storing data therein. The etching stopper 15 serves as a stopper layer while the channel 18 is being formed. More specifically, the channel 18 which has to be relatively shallow is formed simultaneously with the second contact hole 17, and thus the etching stopper 15 ensures that the channel 18 is not formed too deep.

The barrier layer 19 comprises metal such as Ti/TiN. The barrier layer 19 separates the fuse 22 from both the third interlayer insulative layer 16 and the etching stopper 15. The barrier layer 19 extends between the third interlayer insulative layer 16 and an interconnection layer 24 to thereby physically separate the interconnection layer 24 from the third interlayer insulative layer 16. The barrier layer 19 also separates the tungsten plug 22 from surroundings such as the third interlayer insulative layer 16, a second interlayer insulative layer 10, and a first interlayer insulative layer 6.

Hereinbelow will be explained a method for fabricating a semiconductor memory device in accordance with the first embodiment of the invention with reference to FIGS. 5A to 5F which show the same cross-section as a cross-section illustrated in FIG. 3.

Figure 5A:
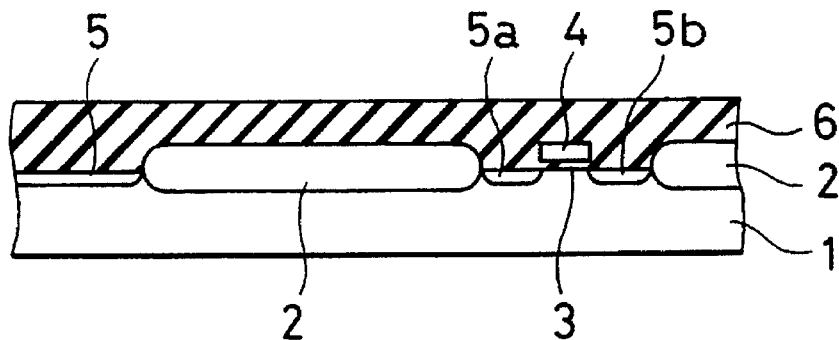
FIGS. 5A to 5F are cross-sectional views showing the steps of a process for fabricating a semiconductor memory device in accordance with the first embodiment.

As illustrated in FIG. 5A, on a surface of a single crystal p type silicon substrate 1 is first formed an oxide layer 2 for element isolation by selective oxidation at a temperature in the range of 800 degrees to 1200 degrees celsius both inclusive by a thickness in the range of 300 nm to 400 nm both inclusive. Then, thermal oxidation is carried out at a temperature in the range of 700 degrees to 800 degrees celsius to form a gate oxidation layer 3 having a thickness in the range of 10 nm to 20 nm both inclusive.

Then, on the resultant structure is deposited a polysilicon layer by chemical vapor deposition (CVD) having a thickness of approximately 150 nm. The polysilicon layer is then patterned to form a gate 4, and subsequently, ion implantation is carried out with the gate 4 serving as a mask to thereby form n type diffusion layers 5a and 5b which will serve as source and drain regions. Over the resultant is deposited the first interlayer insulative layer 6 consisting of a silicon oxide layer having a thickness of approximately 100 nm and a boron phosphorus silicic acid glass (BPSG) layer having a thickness of approximately 200 nm.

Figure 5B:
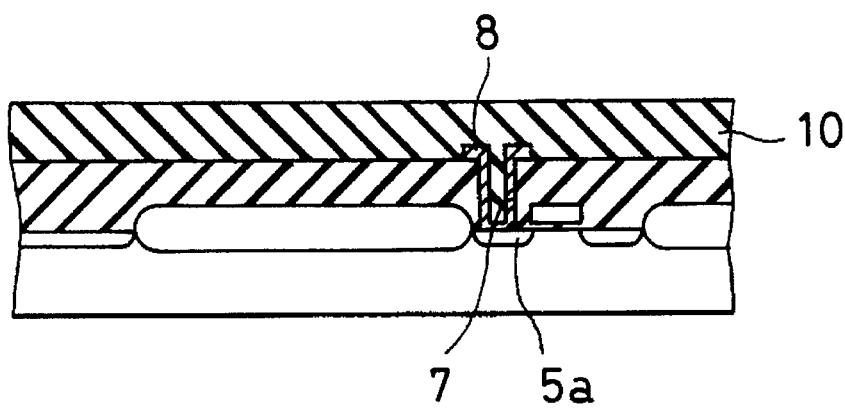

Then, as illustrated in FIG. 5B, above the n type diffusion layer 5a of the MOS transistor is formed a first contact hole 7 by photolithography technique and anisotropic etching. The first contact hole 7 is covered with a tungsten silicide layer having a thickness of approximately 100 nm by sputtering, and then unnecessary portions of the tungsten silicide layer are removed by a photolithography technique and anisotropic etching to form a bit line 8 within the first contact hole 7. Then, the second interlayer insulative layer 10 comprising BPSG and having a thickness of approximately 200 nm is deposited over the resultant structure by CVD.

Figure 5C:
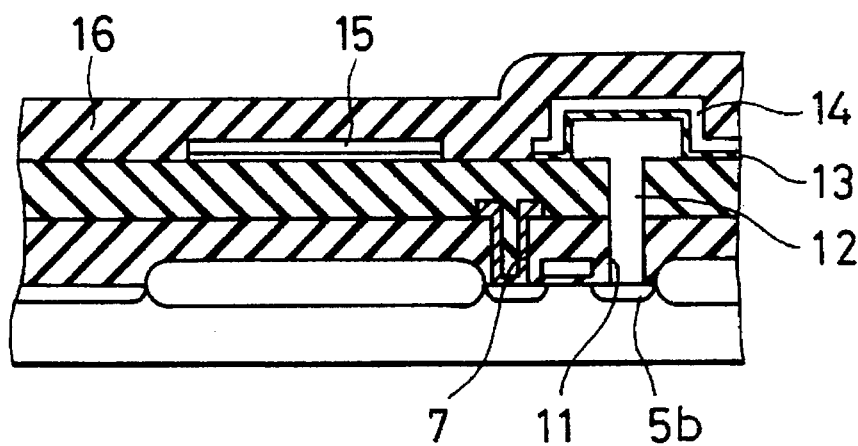

Then, as illustrated in FIG. 5C, above the n type diffusion layer 5b of the MOS transistor is formed a capacitive contact hole 11 by a photolithography technique and anisotropic etching. In the capacitive contact hole 11 is deposited a polysilicon layer having a thickness in the range of 200 nm to 300 nm by CVD. After phosphorus has been diffused in the polysilicon layer, unnecessary portions of the polysilicon layer are removed by a photolithography technique and anisotropic etching to thereby form an accumulation electrode 12, as illustrated in FIG. 5C.

Then, over the resultant structure are deposited a silicon nitride layer having a thickness of approximately 10 nm and a polysilicon layer having a thickness of approximately 150 nm, in this order, by CVD. After phosphorus has been diffused in the polysilicon layer to thereby lower the resistance thereof, unnecessary portions of the silicon nitride layer and the polysilicon layer are removed by a photolithography technique and anisotropic etching to thereby form a capacitive insulative layer 13 and a facing electrode 14. On removal of the unnecessary portions of the two layers, the two layers are left to remain in an area in which a fuse is to be formed. The thus unremoved polysilicon layer will serve as an etching stopper 15. Then, a third interlayer insulative layer 16 made of BPSG and having a thickness of approximately 200 nm is deposited over the resultant structure by CVD.

Figure 5D:
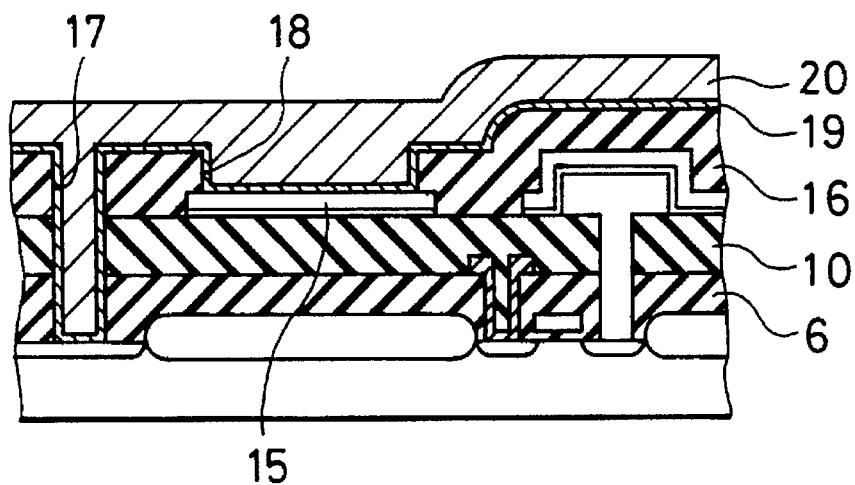

Then, as illustrated in FIG. 5D, a plurality of the second contact holes 17 (only one of them is illustrated in FIG. 5D) are formed above predetermined areas such as the n type diffusion layers 5a and 5b, p type diffusion layers (not illustrated), the gate 4, the bit line 8, and the facing electrode 14 by photolithography technique and anisotropic etching using a mixture gas including therein $CF_4$ and $CHF_3$. At the same time, an area in which a fuse is to be formed is also etched to thereby form a channel 18 therein. Since the etching stopper 15 is already formed in the area in which the channel 18 is formed, only the third interlayer insulative layer 16 is etched when the channel is being formed by etching.

Though the facing electrode 14 is composed of polysilicon in this embodiment, it should be noted that the faring electrode 14 may be composed of a silicide of metal having a high melting point, such as tungsten silicide, or a multilayer of polysilicon and silicide of metal having a high melting point. If the facing electrode 14 is composed of such a material, the etching stopper 15 is inevitably composed of the same material.

Then, over the resultant structure is deposited a barrier layer 19 composed of a multi-layer of Ti/TiN to a thickness of 150 nm. Further, over the resultant is deposited a layer 20 composed of metal having a high melting point, such as tungsten, by a thickness in the range of 500 nm to 1000 nm by CVD so that the second contact holes 17 and the channel 18 are all filled therewith, as illustrated in FIG. 5D.

Figure 5E:
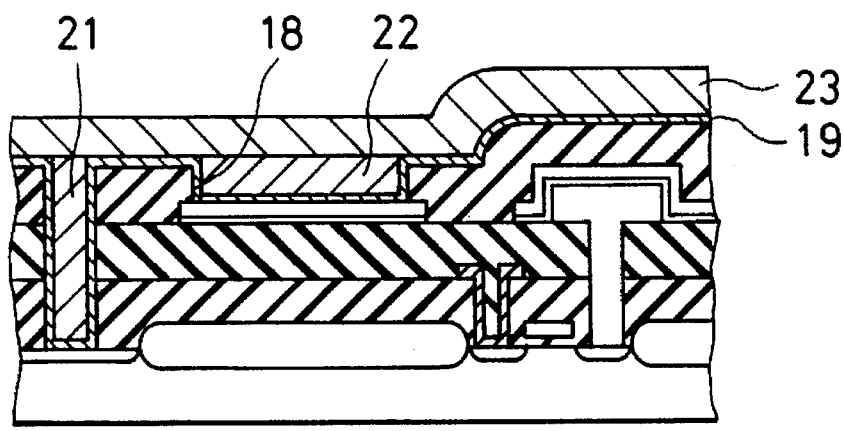

Then, as illustrated in FIG. 5E, the tungsten layer 20 is anisotropically etched back so that tungsten remains only in the second contact holes 17 and the channel 18. Thus, a tungsten plug 21 is formed in the second contact hole 17, and a fuse 22 made of tungsten is formed in the channel 18. Then, the resultant structure is covered with an aluminum layer having a thickness of approximately 500 nm by sputtering to thereby form a layer 23 from which interconnections 24 are to be formed.

Figure 5F:
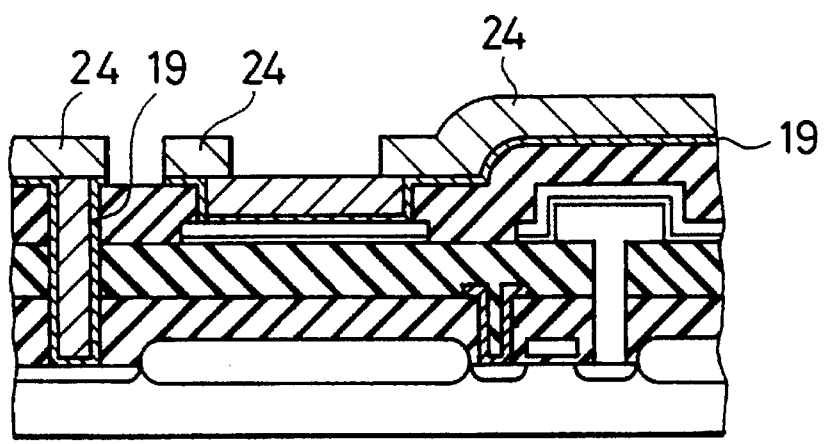

Then, as illustrated in FIG. 5F, unnecessary portions of the layer 23 and the barrier layer 19 are removed, or the layer 23 and the barrier layer 19 are patterned by a photolithography technique and anisotropic etching to thereby form an interconnection layer 24 made of aluminum. If a mixture gas including $Cl_2$ and $BCl_3$ is used in the anisotropic etching, the layer 23 composed of aluminum and the barrier layer 19 composed of Ti/TiN are readily etched, but the plug 21 and the fuse 22 both composed of tungsten are scarcely etched.

[Embodiment 2]

Figure 6:
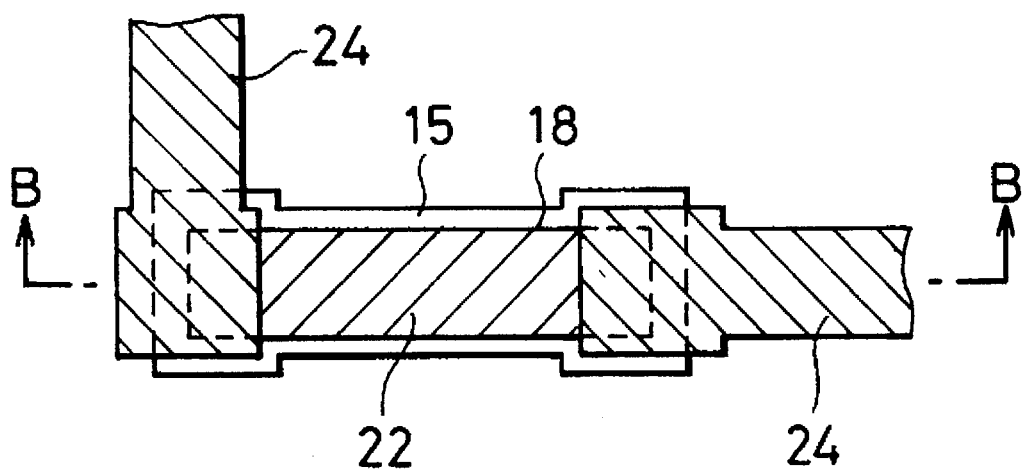
FIG. 6 is a top plan view of a fuse used in a semiconductor memory device in accordance with the second embodiment of the present invention.
Figure 7A:
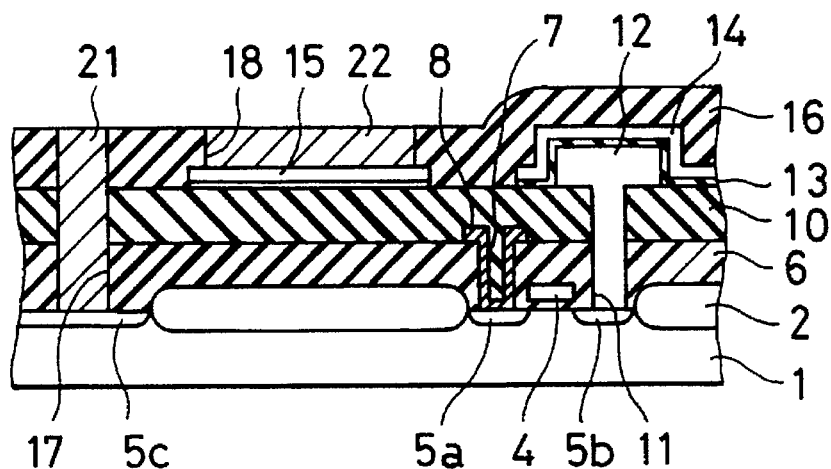
FIGS. 7A to 7C are cross-sectional views showing the steps of a process for fabricating a semiconductor memory device in accordance with the second embodiment.
Figure 7B:
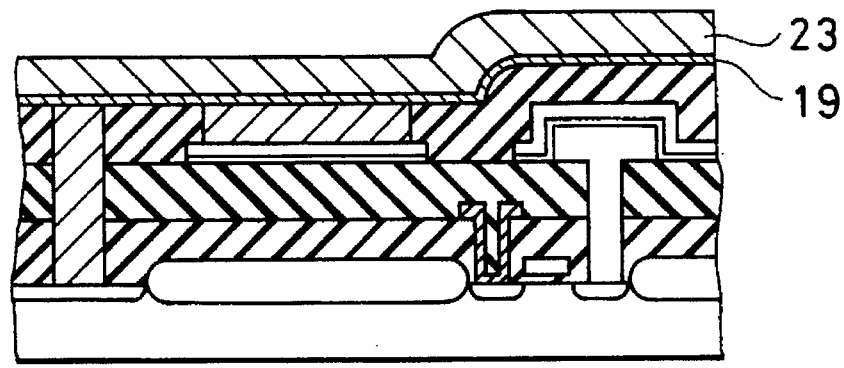
Figure 7C:
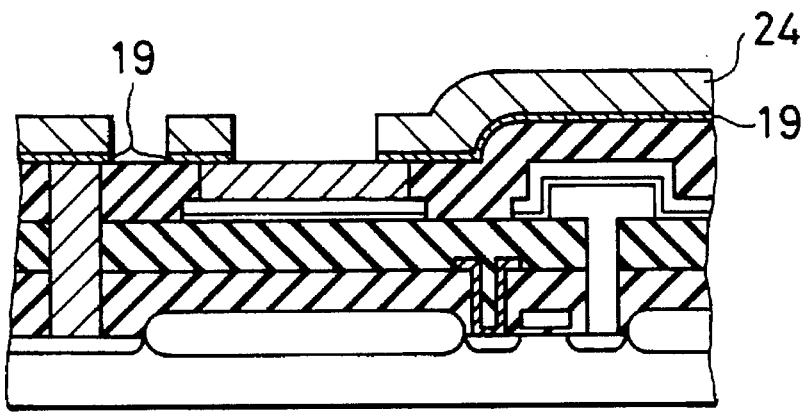

Hereinbelow will be explained the second embodiment in accordance with the invention with reference to FIGS. 6 and 7A to 7C. FIG. 6 is a top plan view illustrating a fuse used in the second embodiment, and FIGS. 7A to 7C show the steps of a process for fabricating a semiconductor memory device in accordance with the invention. FIGS. 7A to 7C are all cross-sectional views taken along the line B—B in FIG. 6.

As will be obvious from the comparison of FIG. 4 illustrating the first embodiment with FIG. 6 illustrating the second embodiment, the second embodiment is different from the first embodiment in that the barrier layer 19 is not formed along an inner surface of the channel 18. In addition, the process for fabricating a semiconductor memory device in accordance with the second embodiment differs from the first embodiment in that the order of a step for filling the second contact holes 17 and the channel 18 with high melting point metal such as tungsten and a step for forming the barrier layer 19 is different. The remaining steps except these two steps are basically common between the first and second embodiments. Accordingly, hereinbelow is explained the steps to be carried out subsequently to the step for depositing high melting point metal in the second contact holes 17 and the channel 18.

In a method used in the second embodiment, the steps having been explained with reference to FIGS. 5A to 5C are also carried out. Then, as illustrated in FIG. 7A, a plurality of the second contact holes 17 (only one of them is illustrated in FIG. 7A) are formed above predetermined areas such as the n type diffusion layers 5a and 5b, p type diffusion layers (not illustrated), the gate 4, the bit line 8, and the faring electrode 14 by a photolithography technique and anisotropic etching using a mixture gas including therein $CF_4$ and $CHF_3$. At the same time, an area in which a fuse is to be formed is also etched to thereby form the channel 18 therein. Then, metal having a high melting point such as tungsten is selectively deposited in the second contact holes 17 and the channel 18 so that the second contact holes 17 and the channel 18 are filled therewith, to thereby form the tungsten plug 21 and the fuse 22.

Then, as illustrated in FIG. 7B, over the resultant is deposited the barrier layer 19 composed of metal such as Ti/TiN to a thickness of approximately 150 nm, and further over the barrier layer 19 is deposited a layer 23 composed of metal such as aluminum by sputtering to a thickness of approximately 500 nm.

Then, as illustrated in FIG. 7C, unnecessary portions of the layer 23 and the barrier layer 19 are removed, or the layer 23 and the barrier layer 19 are patterned by photolithography technique and anisotropic etching to thereby form the interconnection layer 24 made of aluminum.

As having been described, in the embodiments, as a fuse is used metal having a high melting point such as tungsten with which the second contact hole is filled. Accordingly, it is possible to obtain a low resistive fuse without increasing the number of fabrication steps relative to the prior art.

In the above mentioned embodiments, a high melting point metal of which a fuse is composed is exemplified by tungsten (W). Tungsten is preferable because the source gas to be used for CVD of tungsten is easy to handle, and tungsten is not prone to react with silicon. However, it should be noted that tungsten may be substituted with other metals having a high melting point, such as molybdenum (Mo), chromium (Cr) and vanadium (V).

It also should be noted that the invention can be applied to various semiconductor memory devices such as SRAM, EPROM, EEPROM and a flash memory, as well as a DRAM.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A semiconductor memory device wherein a defective bit cell can be substituted with a redundant bit cell by breaking a fuse, said semiconductor memory device comprising:
    an upper insulative layer having an upper and a lower surface;
    a plug formed in a contact hole formed through said upper insulative layer, said plug comprising a metal having a high melting point;
    a fuse formed in a channel formed in the upper surface of said upper insulative layer, said fuse comprising the same material as said plug; and
    an interconnection layer formed on said upper insulative layer and connected to said plug and opposite ends of said fuse.

2. The semiconductor memory device as recited in claim 1, wherein said metal having a high melting point comprises at least one of: tungsten (W), molybdenum (Mo), chromium (Cr) and vanadium (V).

3. The semiconductor memory device as recited in claim 1 further comprising an electrically conductive layer disposed beneath said fuse, said conductive layer serving as an etching stopper while said channel is formed.

4. The semiconductor memory device as recited in claim 3, further comprising a lower insulative layer, wherein said conductive layer comprises the same material as at least one of an electrode and an interconnection layer to be formed on said lower insulative layer.

5. The semiconductor memory device as recited in claim 4, wherein said upper and lower insulative layers comprise of boron phosphorus silicic acid glass (BPSG).

6. The semiconductor memory device as recited in claim 3, wherein said electrically conductive layer comprises at least one of: (a) polysilicon and (b) silicide of metal having a high melting point.

7. The semiconductor memory device as recited in claim 1, wherein said interconnection layer comprises aluminum.

8. The semiconductor memory device as recited in claim 1 further comprising a barrier layer disposed between said upper insulative layer and said interconnection layer and also between said fuse and said interconnection layer and further between said plug and said interconnection layer, said barrier layer comprising metal.

9. The semiconductor memory device as recited in claim 8, wherein said barrier layer comprises at least one of: Ti and TiN.

10. A semiconductor memory device wherein a defective bit cell can be substituted with a redundant bit cell by breaking a fuse, said semiconductor memory device comprising:
    an upper insulative layer having an upper and a lower surface;
    a plug formed in a contact hole formed through said upper insulative layer, said plug comprising metal having a high melting point;
    a fuse formed in a channel formed in the upper surface of said upper insulative layer, said fuse comprising the same material as said plug;
    a barrier layer disposed beneath said fuse, said barrier layer comprising metal; and
    an interconnection layer formed on said upper insulative layer and connected to said plug and opposite ends of said fuse.

11. The semiconductor memory device as recited in claim 10, wherein said barrier layer comprises at least one of: Ti and TiN.

12. The semiconductor memory device as recited in claim 10 further comprising a second barrier layer disposed along the lower and side periphery of said plug.

13. The semiconductor memory device as recited in claim 12, wherein said second barrier layer comprises the same material as said barrier layer.

14. The semiconductor memory device as retired in claim 10, wherein said barrier layer further extends between said upper insulative layer and said interconnection layer.

15. The semiconductor memory device as recited in claim 12, wherein said second barrier layer further extends between said upper insulative layer and said interconnection layer.

16. The semiconductor device as recited in claim 10, wherein said metal having a high melting point comprises at least of one: tungsten (W), molybdenum (Mo), chromium (Cr) and vanadium (V).

17. The semiconductor memory device as recited in claim 10 further comprising art electrically conductive layer disposed beneath said barrier layer, said conductive layer serving as an etching stopper while said channel is formed.

18. The semiconductor memory device as recited in claim 17, further comprising a lower insulative layer, wherein said conductive layer comprises the same material as at least one of: an electrode and an interconnection layer to be formed on said lower insulative layer.

19. The semiconductor memory device as recited in claim 10, wherein said upper and lower insulative layers comprise boron phosphorus silicic acid glass (BPSG) layer.

20. The semiconductor memory device as recited in claim 17, wherein said electrically conductive layer comprises at least one of: (a) polysilicon and (b) silicide of metal having a high melting point.

21. The semiconductor memory device of claim 1, further comprising a lower insulative layer, wherein said contact hole is formed in said upper insulative layer and said lower insulative layer.

22. The semiconductor memory device of claim 21, further comprising:

an electrically conductive layer disposed beneath said fuse; wherein said conductive layer comprises the same material as at least one of: an electrode and an interconnection layer to be formed on said lower insulative layer.

23. The semiconductor memory device of claim 22, wherein said electrically conductive layer comprises at least one of: polysilicon and a silicide of metal having a high melting point.

24. The semiconductor memory device of claim 12, further comprising a lower insulative layer, wherein said contact hole is formed in said upper insulative layer and said lower insulative layer.

25. The semiconductor memory device of claim 24, wherein said metal having a high melting point comprises at least one of: tungsten (w), molybdenum (Mo), chromium (Cr) and vanadium (V).

26. The semiconductor memory device of claim 25, further comprising an electrically conductive layer disposed beneath said barrier layer wherein said conductive layer comprises the same material as at least one of an electrode and an interconnection layer to be formed on said lower insulative layer.

* * * * *